United States Patent
Tanaka

(10) Patent No.: US 12,016,125 B2
(45) Date of Patent: Jun. 18, 2024

(54) ELECTRONIC COMPONENT AND METHOD FOR MANUFACTURING ELECTRONIC COMPONENT

(71) Applicant: DAIKIN INDUSTRIES, LTD., Osaka (JP)

(72) Inventor: Mitsuhiro Tanaka, Osaka (JP)

(73) Assignee: Daikin Industries, Ltd., Osaka (JP)

( * ) Notice: Subject to any disclaimer, the term of this patent is extended or adjusted under 35 U.S.C. 154(b) by 159 days.

(21) Appl. No.: 17/877,667

(22) Filed: Jul. 29, 2022

(65) Prior Publication Data
US 2022/0369462 A1    Nov. 17, 2022

Related U.S. Application Data

(63) Continuation of application No. PCT/JP2021/004989, filed on Feb. 10, 2021.

(30) Foreign Application Priority Data

Feb. 10, 2020    (JP) ................................. 2020-020633

(51) Int. Cl.
| | |
|---|---|
| H05K 1/18 | (2006.01) |
| H05K 3/10 | (2006.01) |
| H05K 3/28 | (2006.01) |
| H05K 7/20 | (2006.01) |

(52) U.S. Cl.
CPC ............ H05K 1/181 (2013.01); H05K 3/107 (2013.01); H05K 3/28 (2013.01); H05K 7/2039 (2013.01)

(58) Field of Classification Search
CPC ................... H05K 1/181; H05K 3/107; H05K 2201/09072; H05K 2201/09909; H05K 2201/10977; H05K 3/284
See application file for complete search history.

(56) References Cited

U.S. PATENT DOCUMENTS

| | | | | |
|---|---|---|---|---|
| 9,978,693 | B2 * | 5/2018 | Jeong | H01L 23/552 |
| 2006/0171127 | A1 * | 8/2006 | Kadoya | H01L 25/165 |
| | | | | 361/752 |
| 2008/0111151 | A1 * | 5/2008 | Teraki | H01L 25/162 |
| | | | | 257/E23.098 |

(Continued)

FOREIGN PATENT DOCUMENTS

| | | |
|---|---|---|
| JP | 56-78185 A | 6/1981 |
| JP | 11-17318 A | 1/1999 |

(Continued)

OTHER PUBLICATIONS

International Preliminary Report of corresponding PCT Application No. PCT/JP2021/004989 dated Aug. 25, 2022.

(Continued)

*Primary Examiner* — Sherman Ng
(74) *Attorney, Agent, or Firm* — Global IP Counselors, LLP

(57) ABSTRACT

An electric component includes a printed circuit board with each of a pair of surfaces serving as a component mounting surface. The component mounting surface has a predetermined region on which electronic components are coated with a resin. A predetermined one of the electronic components in the region is not covered with the resin at a portion above a predetermined height from the component mounting surface.

6 Claims, 3 Drawing Sheets

(56) References Cited

U.S. PATENT DOCUMENTS

| | | | |
|---|---|---|---|
| 2010/0177483 A1* | 7/2010 | Yoshimoto | H05K 7/142 |
| | | | 361/752 |
| 2012/0017436 A1 | 1/2012 | Wing et al. | |
| 2012/0069529 A1* | 3/2012 | Chen | H01L 23/552 |
| | | | 361/729 |

FOREIGN PATENT DOCUMENTS

| | | |
|---|---|---|
| JP | 2000-4075 A | 1/2000 |
| JP | 2001-44333 A | 2/2001 |
| JP | 2001-357952 A | 12/2001 |
| JP | 2003-254809 A | 9/2003 |
| JP | 2014-21478 A | 2/2014 |
| WO | 2008/075401 A1 | 6/2008 |

OTHER PUBLICATIONS

International Search Report of corresponding PCT Application No. PCT/JP2021/004989 dated Apr. 27, 2021.
European Search Report of corresponding EP Application No. 21 75 4365.1 dated Nov. 29, 2023.

* cited by examiner

ELECTRONIC COMPONENT AND METHOD FOR MANUFACTURING ELECTRONIC COMPONENT

CROSS-REFERENCE TO RELATED APPLICATIONS

This is a continuation of International Application No. PCT/JP2021/004989 filed on Feb. 10, 2021, which claims priority to Japanese Patent Application No. 2020-020633, filed on Feb. 10, 2020. The entire disclosures of these applications are incorporated by reference herein.

BACKGROUND

Technical Field

The present disclosure relates to an electric component and a method for manufacturing an electric component.

Background Art

A printed circuit board included in an electric component may include an electronic component coated with a resin to protect the electronic component from moisture, dust, and any other substances (see, for example, Japanese Unexamined Patent Publication No. 2003-254809). In the example of Japanese Unexamined Patent Publication No. 2003-254809, a printed circuit board and components are integrally molded by hot-melt molding.

SUMMARY

A first aspect of the present disclosure is directed to an electric component including a printed circuit board with each of a pair of surfaces serving as a component mounting surface. The component mounting surface has a predetermined region on which electronic components are coated with a resin. A predetermined one of the electronic components in the region is not covered with the resin at a portion above a predetermined height from the component mounting surface.

DETAILED DESCRIPTION OF EMBODIMENT(S)

First Embodiment

An exemplary power converter will now be described as an embodiment of an electric component. A power converter is incorporated into, for example, an air conditioner.

Configuration of Electric Component

Figure 1:
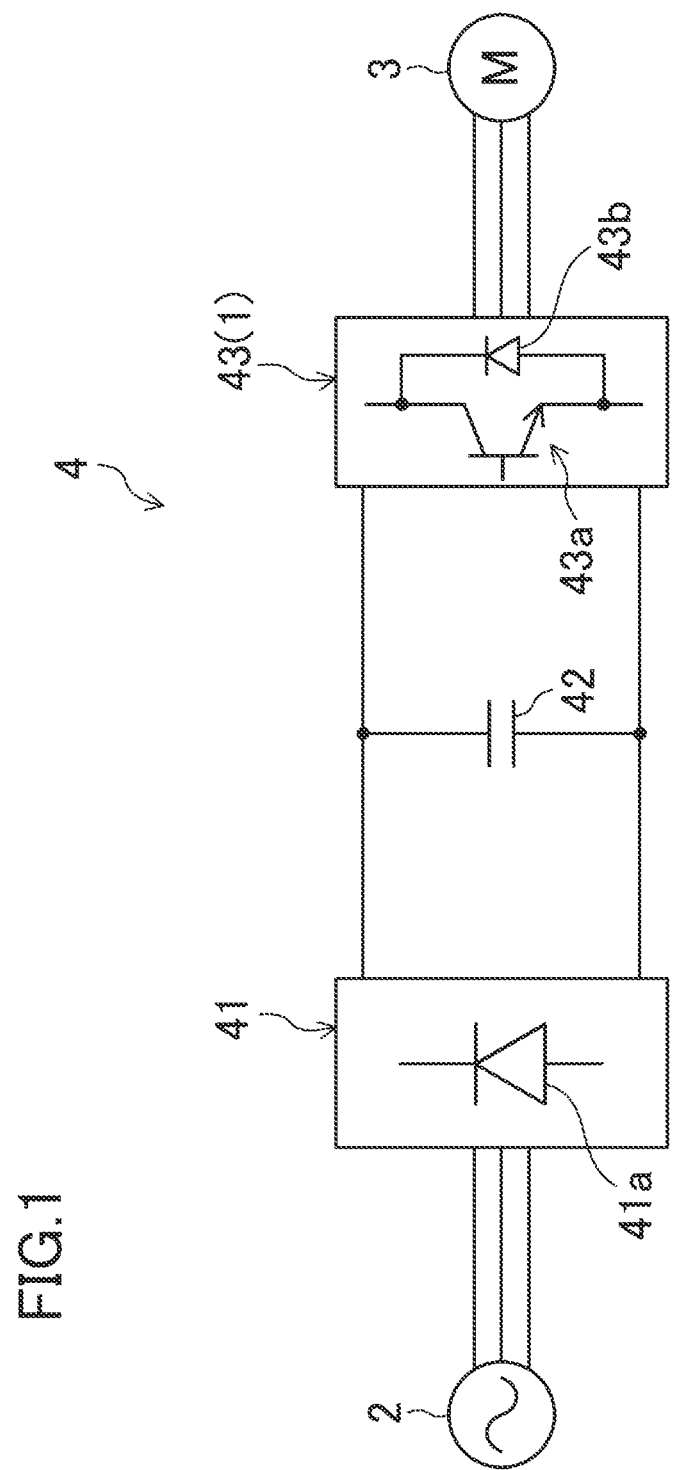
FIG. 1 is a block diagram illustrating an exemplary configuration of a power converter.

FIG. 1 is a block diagram illustrating an exemplary configuration of a power converter (4). The power converter (4) includes a converter circuit (41), a smoothing capacitor (42), and an inverter circuit (43). The power converter (4) supplies alternating current (AC) power to a motor (3).

The converter circuit (41) rectifies an alternating current output from an AC power source (2). The converter circuit (41) includes a plurality of diodes (41a). These diodes (41a) are encapsulated in one package.

The smoothing capacitor (42) is connected in parallel to the converter circuit (41). The smoothing capacitor (42) smooths the output of the converter circuit (41).

The smoothing capacitor (42) is configured by an electrolytic capacitor. The smoothing capacitor (42) is an electronic component in the form of a cylinder. A terminal (not shown) is formed at one end of the smoothing capacitor (42) (one end of the cylinder). A pressure valve (42a) is formed on the surface of the other end of the smoothing capacitor (42).

The inverter circuit (43) is also connected in parallel to the converter circuit (41). The inverter circuit (43) converts the output of the converter (41) into alternating current with a predetermined voltage. The inverter circuit (43) outputs the alternating current to a load (in this example, the motor (3)).

The inverter circuit (43) includes a plurality of switching elements (43a). A freewheeling diode (43b) is connected in antiparallel to each of the switching elements (43a). These switching elements (43a) are switched between "on" and "off" states by a drive circuit (not shown). The inverter circuit (43) converts the output of the converter circuit (41) into alternating current with a predetermined voltage by on/off operations of the switching elements (43a).

The inverter circuit (43) is encapsulated in one package together with peripheral circuits, such as the drive circuit. This package is hereinafter referred to as the "power module (1)." The power module (1) has a predetermined surface serving as a heat dissipating surface (1a). The heat dissipating surface (1a) is used to dissipate heat from internal electronic components (such as the switching elements 43a)) to the outside of the package. A heat sink (16) is attached to the heat dissipating surface (1a).

Mounting of Elements for Electric Component

Figure 2:
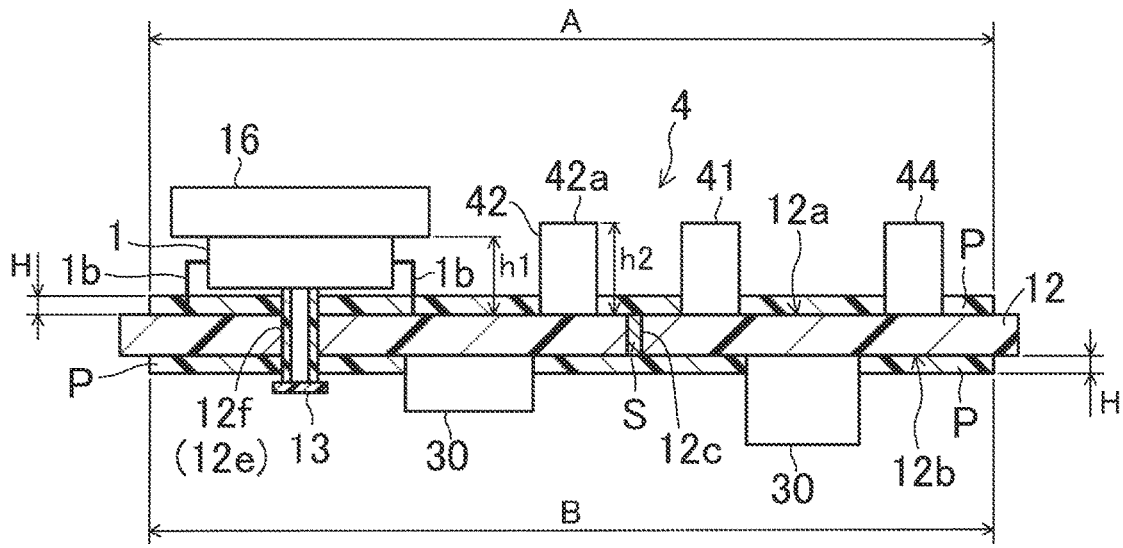
FIG. 2 is a cross-sectional view of a printed circuit board.

Electronic components, such as the power module (1), the smoothing capacitor (42), and the diodes (41a), are mounted on the printed circuit board (12). FIG. 2 is a cross-sectional view of the printed circuit board (12). Both sides of the printed circuit board (12) are component mounting surfaces (12a, 12b).

Various connectors (44) are also mounted on the printed circuit board (12). The connectors (44) are used, for example, to connect the output (AC power) of the inverter circuit (43) to the load (the motor (3)). Other electronic components (30) are also mounted on the printed circuit board (12) (see FIG. 2).

The printed circuit board (12) has a plurality of open holes (hereinafter referred to as the "through holes (12c)"). The through holes (12c) are formed for the purpose of providing continuity between the component mounting surfaces (12a, 12b) and any other purposes.

Terminals of the package for the diodes (41a) and the smoothing capacitor (42) are soldered to a wiring pattern (12d) on the printed circuit board (12). Terminals (1b) of the power module (1) are also soldered to the wiring pattern (12d) on the printed circuit board (12).

The package for the power module (1) is fixed to the printed circuit board (12) with a screw (13). The printed circuit board (12) has an open hole (hereinafter referred to as the "screw hole (12e)") for passing the screw (13).

Electronic components (not shown) entirely coated with a coating resin (P) and electronic components only partially coated with the coating resin (P) (electronic components partially exposed from the coating resin (P)) lie on a predetermined region (A, B) of the component mounting surface (12a, 12b).

The electronic components are partially exposed from the coating resin (P) because some electronic components are better not to be coated entirely. For example, it is better not to cover the pressure valve (42a) of the smoothing capacitor (42) with the coating resin (P) in order that the pressure valve (42a) function properly. It is also better not to cover the heat dissipating surface (1a) of the power module (1) with the coating resin (P) because the heat sink (16) is attached to the heat dissipating surface (1a). Another reason for partially exposing the electronic components from the coating resin (P) is to minimize the amount of resin required for coating and thereby lowering the manufacturing cost of the electric components.

In this embodiment, the electronic components partially exposed from the coating resin (P) are not covered with the coating resin (P) at a portion above a predetermined height (H). The height (H) is the height from the component mounting surface (12a, 12b).

The height (H) is determined so that the pressure valve (42a) and the heat dissipating surface (1a) are exposed from the coating resin (P). Here, the height h2 represents the height from the component mounting surface (12a) where the smoothing capacitor (42) is provided, to the pressure valve (42a). The height h1 represents the height from the component mounting surface (12a) where the power module (1) is provided, to the heat dissipating surface (1a). The relation "H<h1 and H<h2" is satisfied to expose the pressure valve (42a) and the heat dissipating surface (1a) from the coating resin (P) under such dimensional definitions.

Figure 3:
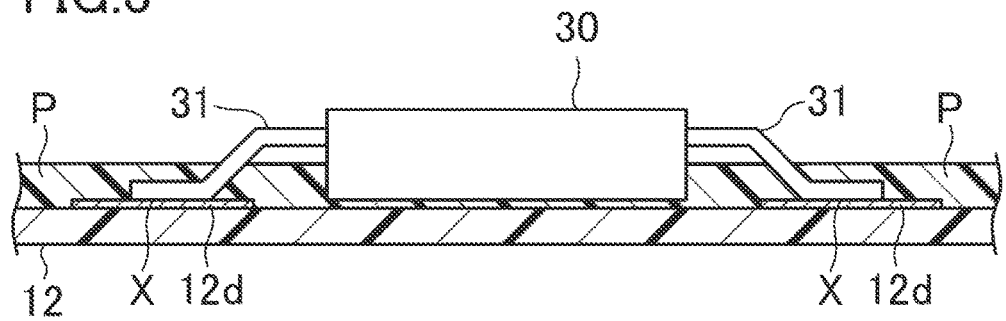
FIG. 3 is a diagram illustrating the joint portions between terminals of an electronic component and wiring patterns.

In the region (A, B), the surface of the printed circuit board (12) is covered with the coating resin (P). Specifically, in the region (A, B), the joint portions (X) between the electronic components and the wiring pattern (12d) are covered with the coating resin (P). This provides effective protection between different types of metals that easily cause corrosion. FIG. 3 is a diagram illustrating the joint portions (X) between terminals (31) of an electronic component (30) and the wiring pattern (12d).

Example of Manufacturing Process

A power converter (4) (an electric component) can be manufactured by the following process as an example. A precondition for the implementation of the following process is that electronic components (such as the power module (1)) have been soldered to the printed circuit board (12). The through holes (12c) in the regions (A, B) are filled with solder (S). The solder (S) serves as a plug that fills each through hole (12c).

Figure 4:
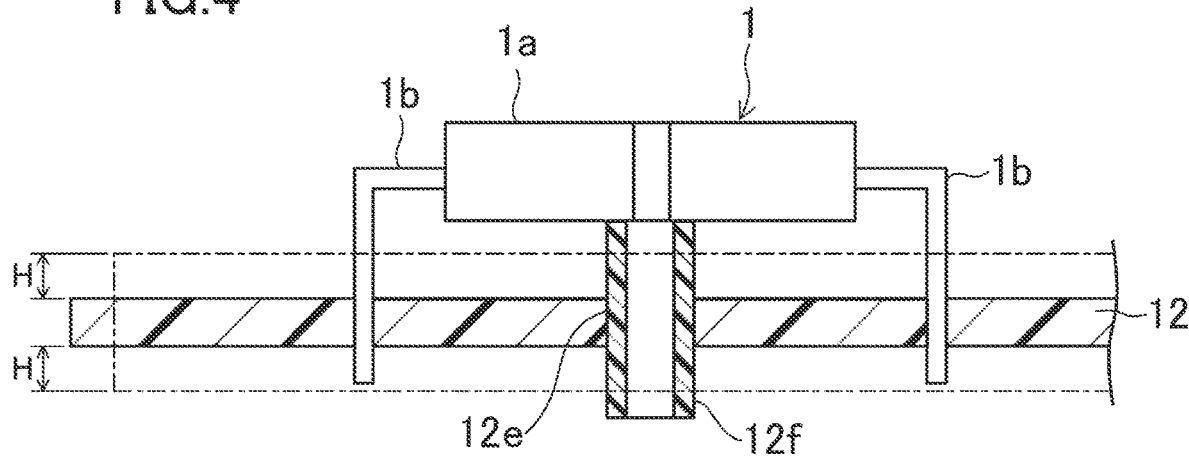
FIG. 4 is a diagram illustrating a state where a pipe is attached to the printed circuit board.

A printed circuit board provided with a plug that stops a resin material (a resin material (M) to be described below) from flowing into the screw hole (12e) is used as the printed circuit board (12). In this example, the plug is configured as a pipe (12f). FIG. 4 is a diagram illustrating a state where the pipe (12f) is attached to the printed circuit board (12).

As illustrated in FIG. 4, a plug having a height greater than the height (H) of the coating resin (P) from the component mounting surface (12a, 12b) is used as the plug (pipe (12f)). The inside diameter of the pipe (12f) is set to allow the screw (13) to pass. The outside diameter of the pipe (12f) is substantially equal to the diameter of the screw hole (12e).

First Step

In a first step, the resin material (M) for a coating resin (P) is prepared. A material that has flowability during the manufacturing phase and is curable is used as the resin material (M). As an example, a urethane resin can be used as the resin material (M). In this embodiment, a mixture (a liquid material) of a urethane resin as the principal ingredient to which a curing agent is added is prepared.

Figure 5:
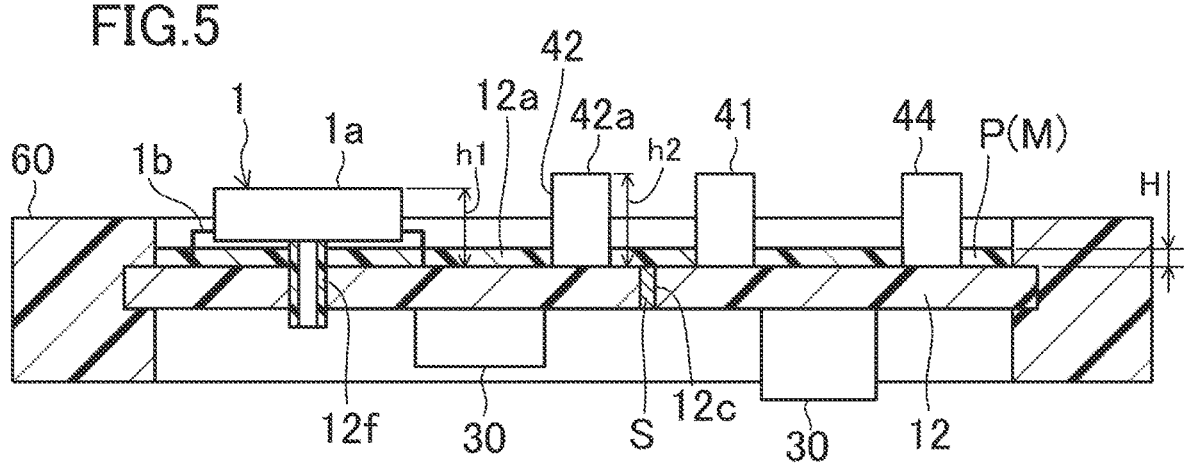
FIG. 5 is a diagram illustrating a state where a jig is attached to the printed circuit board.

In the first step, a jig (60) is attached to the printed circuit board (12). The jig (60) is used to stop the resin material (M) from flowing out of the region (A). FIG. 5 is a diagram illustrating a state where the jig (60) is attached to the printed circuit board (12).

The jig (60) is configured to be fitted to the outer periphery of the printed circuit board (12) (see FIG. 5). The jig (60) is a frame surrounding the region (A). The jig (60) is in contact with the component mounting surface (12a) on the outside of the region (A). The height of the jig (60) from the component mounting surface (12a) is set to be slightly greater than the height (H) of the coating resin (P). The foregoing configuration allows the jig (60) to function as a dam for stopping the flow of the resin material (M) on the component mounting surface (12a).

The jig (60) may be made of metal, as an example. It is recommended to apply a mold release agent to the jig (60) as needed.

In the first step, the resin material (M) in the form of liquid is supplied to the region (A) of one of the component mounting surfaces (in this case, the component mounting surface (12a)). The supply amount of the resin material (M) is adjusted so that the coating resin (P) has a height equal to or less than a target height (H) and that the coating resin (P) covers the joint portions (X). This adjustment only needs a slight trial-and-error process.

In the first step, the supplied resin material (M) is cured. To cure the resin material (M), the resin material (M) may be, for example, left indoors or heated in a heating furnace, depending on the properties of the resin material (M).

Second Step

A second step is performed after the resin material (M) supplied in the first step is cured. The height of the jig (60) attached in the first step from the component mounting surface (12b) is set to be slightly greater than the height (H) of the coating resin (P). The jig (60) is in contact with the component mounting surface (12b) on the outside of the region (B). The foregoing configuration allows the jig (60) to function also as a dam for stopping the flow of the resin material (M) on the component mounting surface (12b) (see FIG. 5).

Figure 6:
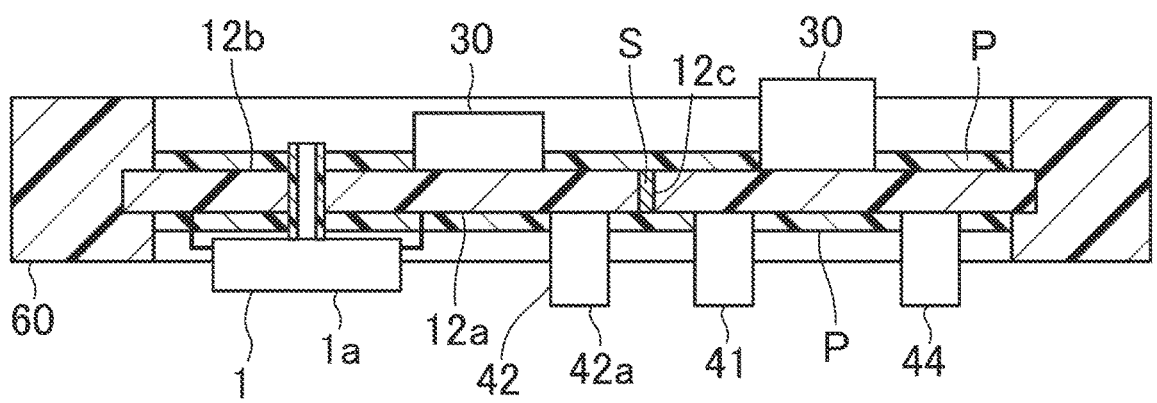
FIG. 6 is a diagram illustrating a state where a resin material is supplied in a second step.

In the second step, the printed circuit board (12) is turned upside down from the work state in the first step so that the component mounting surface (12b) faces upward (FIG. 6). Thereafter, in the second step, the resin material (NI) having flowability is supplied to the region (B) of the component mounting surface (12b). The supply amount of the resin material (M) is adjusted so that the coating resin (P) has a height equal to or less than a target height (H) and that the coating resin (P) covers the joint portions (X). This adjustment, too, only needs a slight trial-and-error process.

In the second step, too, the supplied resin material (M) is cured. To cure the resin material (M), the resin material (M) may be, for example, left indoors or heated in a heating furnace, depending on the properties of the resin material (M) in the second step, as well.

The jig (60) is removed at a predetermined timing after the completion of supply of the resin material (M) in the second step. The removal of the jig (60) does not always have to be after the complete curing of the resin material (M). In this embodiment, it is not necessary to remove the pipe (12f). The screw (13) for fixing the power module (1) is passed through the pipe (12f).

As can be seen from the foregoing description, the present disclosure is directed to an electric component including a printed circuit board (12) with each of both surfaces serving as a component mounting surface (12a, 12b). The component mounting surface (12a, 12b) has a predetermined region (A, B) on which electronic components are coated with a resin (P), and a predetermined one of the electronic components in the region (A, B) is not covered with the resin (P) at a portion above a predetermined height (H) from the component mounting surface (12a, 12b).

Advantages of Embodiment

As can be seen from the foregoing description, in this embodiment, the predetermined electronic component in the region (A, B) is not covered with the coating resin (P) at a portion above the predetermined height (H) from the component mounting surface (12a, 12b). In this embodiment, the pressure valve (42a) of the smoothing capacitor (42) is exposed from the coating resin (P). This embodiment enables proper functioning of the pressure valve (42a).

In this embodiment, the heat dissipating surface (1a) of the power module (1) is not covered with the coating resin (P). In this embodiment, the coating resin (P) does not hinder the attachment of the heat sink (16). In this embodiment, the heat sink (16) can be easily attached to the power module (1).

The printed circuit board (12) of this embodiment has a pipe (120 in the screw hole (12e). The pipe (120 stops the resin material (M) from flowing into the screw hole (12e). In this embodiment, the coating resin (P) does not fill the screw (13). In this embodiment, the power module (1) can be easily fixed to the printed circuit board (12) with the screw (13).

In this embodiment, the resin material (M) is retained within the desired region (A, B) by the jig (60). In this embodiment, the coating area (target electronic components) can be easily set by the jig (60). The height (H) of the coating resin (P) can be adjusted easily by setting the height of the jig (60), which can reduce the resin material cost.

Second Embodiment

Figure 7:
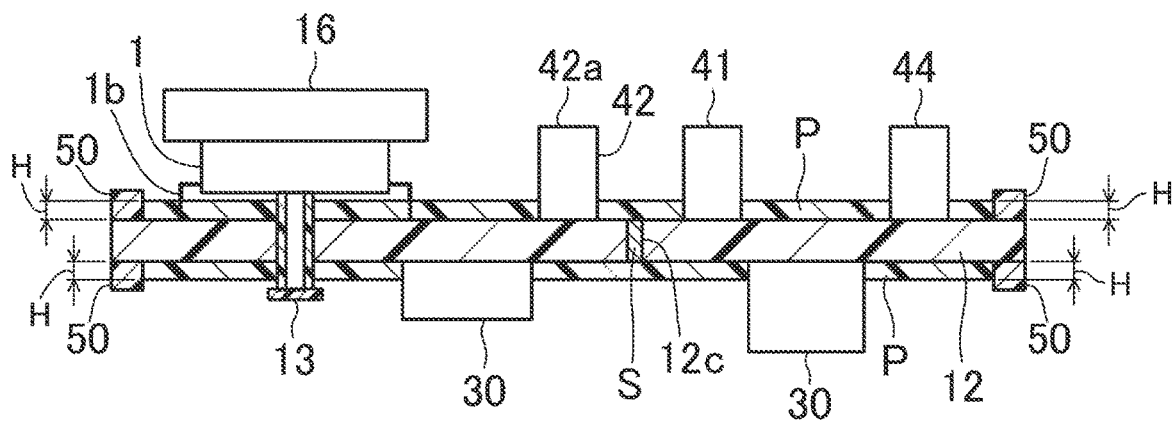
FIG. 7 is a diagram illustrating a power converter according to a second embodiment.

FIG. 7 is a diagram illustrating a power converter (4) according to a second embodiment. In this embodiment, too, an electronic component constituting the power converter (4) is the same as, or similar to, that of the first embodiment. This embodiment is different from the first embodiment in the configuration of a printed circuit board (12). In this embodiment, a printed circuit board provided with a dam (50) for stopping the resin material (M) from flowing out of the region (A, B) is used as the printed circuit board (12).

The dam (50) is provided on each of the component mounting surfaces (12a, 12b). The dam (50) is provided generally along the outer periphery of the printed circuit board (12). The height of the dam (50) from the component mounting surface (12a, 12b) is set to be slightly greater than the height (H) of a coating resin (P).

Example of Manufacturing Process

Similarly to the first embodiment, in the power converter (4) of this embodiment, too, the coating resin (P) can be provided by the first step and the second step. In this embodiment, the printed circuit board (12) including the dam (50) is used. This eliminates the need for the work of attaching and detaching a jig (60).

Advantages of Embodiment

This embodiment can also provide advantages that are the same as, or similar to, those of the first embodiment. In this embodiment, attachment and detachment of the jig (60) are not needed. The elimination of the use of the jig (60) simplifies the manufacturing process in this embodiment.

Other Embodiments

The plugs for the through holes (12c) are not limited to solder (S). In general, a solder resist is applied to the printed circuit board (12). A solder resist applied to each through hole (12c) may be used as a plug.

The plug for the through hole (12c) is not essential. Some of various conditions, such as the viscosity of the resin material (M), may prevent even the fluidized resin material (M) from entering the through holes (12c). In such a case, it is not necessary to provide a plug for the through hole (12c).

The plug for the screw hole (12e) is not limited to the pipe (12f). For example, a solid plug can be used instead of the pipe (12f). In this case, the solid plug is used as a jig. This jig (solid plug) may be removed at a predetermined timing after the resin material (M) is supplied.

The jig (60) is not essential. The flow area of the resin material (M) may be limitable through adjustment of the supply amount or supply position of the resin material (M), for example. If the flow area is limitable, it is not necessary to provide the jig (60). Likewise, the dam (50) for the printed circuit board (12) is not essential.

Only electronic components that need to be exposed may be exposed from the coating resin (P). For example, it is conceivable that none of the electronic components is exposed on one of the component mounting surfaces.

The power converter (4) is merely an example of an electric component. The coating technique of the present disclosure is applicable also to printed circuit boards for other apparatuses.

The shape of the jig (60) is not limited to that shown in each of the embodiments as long as the jig (60) has the function of stopping the flow of the resin material (M). The material of the jig (60) is also merely an example. The jig (60) may be made of a resin, for example.

The urethane resin described as the resin material (M) is also merely an example. The resin material (M) may be, for example, a nylon resin.

While the embodiments and variations thereof have been described above, it will be understood that various changes in form and details may be made without departing from the spirit and scope of the claims. The embodiments and the variations thereof may be combined and replaced with each other without deteriorating intended functions of the present disclosure.

As can be seen from the foregoing description, the present disclosure is useful for an electric component and a method for manufacturing an electric component

The invention claimed is:

1. An electric component, comprising:
a printed circuit board with each of a pair of surfaces serving as a component mounting surface,
the component mounting surface having a predetermined region on which electronic components are coated with a resin, a predetermined one of the electronic components in the region being not covered with the resin at a portion above a predetermined height from the component mounting surface, the printed circuit board having an open hole, and the printed circuit board being provided with a plug to stop the resin material from flowing into the open hole.

2. The electric component of claim 1, wherein the electronic components coated with the resin are coated with the resin at a joint portion between each of the electronic components and a wiring pattern on the printed circuit board.

3. A method for manufacturing an electric component including a printed circuit board with each of a pair of surfaces serving as a component mounting surface, the method for manufacturing the electric component comprising:

a first step of supplying a resin material having flowability to a first predetermined region of one of the component mounting surfaces, and curing the resin material to coat the first predetermined region and electronic components in the first predetermined region with resin; and a second step of supplying the resin material having flowability to a second predetermined region of an other one of the component mounting surfaces, and curing the resin material to coat the second predetermined region and electronic components in the second predetermined region with resin, the first and second steps being sequentially performed, in each of the first and second steps, the resin material being supplied so that a predetermined one of the electronic components in each of the first and second predetermined regions is not covered with resin at a portion above a predetermined height from the component mounting surface, the printed circuit board having an open hole, and the printed circuit board being provided with a plug to stop the resin material from flowing into the open hole.

4. The method of claim 3, wherein in the first and second steps, the printed circuit board is provided with a dam to stop the resin material from flowing out of the first and second predetermined regions.

5. The method of claim 3, further comprising:

attaching a jig to the printed circuit board, the jig being configured to stop the resin material from flowing out of the first and second predetermined regions.

6. The method of claim 3, further comprising:

attaching, as a jig, the plug to fill the open hole, to the printed circuit board before supplying the resin material to the first and second predetermined regions; and removing the plug at a predetermined timing after the supplying of the resin material to the first predetermined region, the plug having a height greater than a height of the resin from the component mounting surface.

* * * * *